(12) United States Patent
Zhou

(10) Patent No.: US 10,134,836 B2
(45) Date of Patent: Nov. 20, 2018

(54) SEMICONDUCTOR DEVICE AND METHOD OF FABRICATING THE SAME

(71) Applicant: United Microelectronics Corp., Hsinchu (TW)

(72) Inventor: Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/476,751

(22) Filed: Mar. 31, 2017

(65) Prior Publication Data

US 2018/0219063 A1  Aug. 2, 2018

(30) Foreign Application Priority Data

Feb. 2, 2017  (TW) ................. 106103493

(51) Int. Cl.

| | |
|---|---|
| *H01L 29/06* | (2006.01) |
| *H01L 27/12* | (2006.01) |
| *H01L 21/762* | (2006.01) |
| *H01L 23/535* | (2006.01) |
| *H01L 21/84* | (2006.01) |
| *H01L 29/66* | (2006.01) |
| *H01L 49/02* | (2006.01) |

(52) U.S. Cl.
CPC .... *H01L 29/0649* (2013.01); *H01L 21/76289* (2013.01); *H01L 21/84* (2013.01); *H01L 23/535* (2013.01); *H01L 27/1203* (2013.01); *H01L 28/10* (2013.01); *H01L 29/66545* (2013.01)

(58) Field of Classification Search
CPC ........... H01L 29/0649; H01L 29/66545; H01L 21/76289; H01L 21/84; H01L 23/535; H01L 27/1203; H01L 28/10
See application file for complete search history.

(56) References Cited

U.S. PATENT DOCUMENTS

| | | | |
|---|---|---|---|
| 8,502,316 B2 | 8/2013 | Fung et al. | |
| 9,455,176 B2 | 9/2016 | Tsao et al. | |
| 2011/0012629 A1* | 1/2011 | Chakravarti | ........ H01L 23/5252 324/713 |
| 2012/0040522 A1* | 2/2012 | Cheng | ............ H01L 21/823462 438/585 |
| 2013/0175660 A1* | 7/2013 | Fu | ..................... H01L 21/82345 257/506 |
| 2015/0084064 A1* | 3/2015 | Yamamoto | ........ H01L 29/42376 257/77 |
| 2015/0206759 A1 | 7/2015 | Tsao et al. | |
| 2017/0084739 A1 | 3/2017 | Hsiao et al. | |
| 2017/0221769 A1* | 8/2017 | Park | ................ H01L 21/823821 |

\* cited by examiner

*Primary Examiner* — Cheung Lee
*Assistant Examiner* — Stephen C Smith
(74) *Attorney, Agent, or Firm* — J.C. Patents

(57) ABSTRACT

A semiconductor device and a method of fabricating the same are provide. The fabricating method includes providing a silicon-on-insulator (SOI) substrate that includes, from bottom to top, a substrate, a first insulating layer and a semiconductor layer. The semiconductor layer is patterned to form a plurality of dummy patterns. A second insulating layer is formed around the plurality of dummy patterns. The plurality of dummy patterns are removed to form a plurality of openings. A dielectric structure is formed on the substrate and fills into the plurality of openings.

3 Claims, 13 Drawing Sheets

SEMICONDUCTOR DEVICE AND METHOD OF FABRICATING THE SAME

CROSS-REFERENCE TO RELATED APPLICATION

This application claims the priority benefit of Taiwan application serial no. 106103493, filed on Feb. 2, 2017. The entirety of the above-mentioned patent application is hereby incorporated by reference herein and made a part of this specification.

BACKGROUND OF THE INVENTION

Field of Invention

The present invention relates to a semiconductor device and a method of fabricating the same.

Description of Related Art

A silicon-on-insulator (SOI) metal oxide semiconductor (MOS) device has the advantages of a high component density, a low threshold voltage, a small parasitic capacitance etc., so it has drawn more attention in the industry. However, during a process of fabricating a SOI MOS device, different device densities in respective regions on a substrate cause a loading effect and therefore a difficulty for the subsequent processes, and thus, the device reliability is affected.

SUMMARY OF THE INVENTION

Accordingly, the present invention provides a method of fabricating a semiconductor device, by which the loading effect caused by different device densities in respective regions on a substrate can be reduced, and the issues such as a difficulty in process and a low reliability can be avoided.

The present invention provides a method of fabricating a semiconductor device that includes the following steps. A semiconductor-on-insulator (SOI) substrate is provided, wherein the SOI substrate includes, from bottom to top, a substrate, a first insulating layer and a semiconductor layer. The semiconductor layer is patterned to form a plurality of dummy patterns. A second insulating layer is formed around the plurality of dummy patterns. The plurality of dummy patterns are removed to form a plurality of openings. A dielectric structure is formed on the substrate and fills into the plurality of openings.

According to an embodiment of the present invention, the method further includes, after forming the second insulating layer around the plurality of dummy patterns, forming an etching stop layer on the substrate and patterning the etching stop layer.

According to an embodiment of the present invention, the method further includes the following steps. Before forming the etching stop layer on the substrate, a gate dielectric layer is formed on the substrate. A plurality of dummy gates are formed on the gate dielectric layer and correspond to the plurality of dummy patterns. Before removing the plurality of dummy patterns, the plurality of dummy gates and a portion of the gate dielectric layer are removed.

According to an embodiment of the present invention, the step of forming the dielectric structure on the substrate includes the following steps. Before patterning the etching stop layer, a first dielectric layer is formed on the etching stop layer and the first dielectric layer is patterned to form a first patterned dielectric layer. After patterning the etching stop layer and removing the plurality of dummy patterns, a second dielectric layer is formed, wherein the second dielectric layer covers the first patterned dielectric layer and fills into the plurality of openings.

According to an embodiment of the present invention, the method further includes, after removing the plurality of dummy patterns to form the plurality of openings, forming an etching stop layer on the substrate, wherein the etching stop layer covers a surface of the second insulating layer and sidewalls and bottoms of the plurality of openings.

The present invention further provides a semiconductor device that includes an insulating structure disposed on a substrate and having a plurality of openings, and a dielectric structure disposed on the insulating structure and extending into the plurality of openings.

According to an embodiment of the present invention, the semiconductor device further includes an etching stop layer interposed between the insulating structure and the dielectric structure.

According to an embodiment of the present invention, the etching stop layer further extends to cover sidewalls and bottoms of the plurality of openings.

According to an embodiment of the present invention, the dielectric structure includes a first patterned dielectric layer disposed on the etching stop layer, and a second dielectric layer disposed on the first patterned dielectric layer and extending into the plurality of openings.

According to an embodiment of the present invention, the insulating structure includes a first insulating layer disposed on the substrate, and a second insulating layer having the plurality of openings and disposed between the first insulating layer and the etching stop layer.

According to an embodiment of the present invention, the dielectric structure in each of the plurality of openings has an inverted-Y shaped interface.

According to an embodiment of the present invention, the dielectric structure in the plurality of openings has a plurality of air gaps.

According to an embodiment of the present invention, the semiconductor device further includes an element disposed on the dielectric structure.

According to an embodiment of the present invention, the element includes an inductor, a ground-signal-ground (GSG) pad or a combination thereof.

In view of the above, during the method of fabricating a device of the invention, dummy patterns and optional dummy gates are formed on a substrate in a sparse area, so the sparse area has a density or hardness comparable to that of the dense area. Therefore, during the subsequent polishing process, the loading effect caused by different device densities in respective regions on the substrate can be avoided. The dummy patterns and dummy gates are then removed from the sparse area before the subsequent processes for the device are performed. Thus, the device performance is not affected by the dummy gates since the dummy gates do not remain on the substrate.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
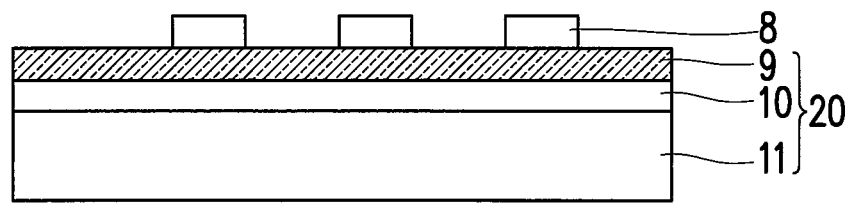
FIG. 1A to FIG. 1H are cross-sectional views of a method of fabricating a semiconductor device in accordance with a first embodiment of the concept of the present invention.

The present invention may be embodied in various forms and is not limited to the embodiments described herein. For the sake of clarity, the same reference numbers are used in the drawings and the description to refer to the same or like parts.

FIG. 1A to FIG. 1H are cross-sectional views of a method of fabricating a semiconductor device in accordance with a first embodiment of the concept of the present invention.

Referring to FIG. 1A, a semiconductor-on-insulator (SOI) substrate 20 is provided. The SOI substrate 20 includes, from bottom to top, a substrate 11, a first insulating layer 10 and a semiconductor layer 9. The substrate 11 includes silicon. The first insulating layer 10 includes silicon oxide. The first insulating layer 10 is buried between the substrate 11 and the semiconductor layer 9, so it is called a buried insulating layer. The semiconductor layer 9 includes silicon, such as monocrystalline silicon. The semiconductor layer 9 is provided with a dopant therein or free of dopants. The dopant can be a P-type or N-type dopant. The P-type dopant includes boron. The N-type dopant includes phosphor or arsenic.

Thereafter, a patterned mask layer 8 is formed on the semiconductor layer 9. The patterned mask layer 8 includes a photoresist material. The method of forming the patterned mask layer 8 includes forming a photoresist layer on the SOI substrate 20, and preforming exposure and development steps to the photoresist layer.

Figure 1B:
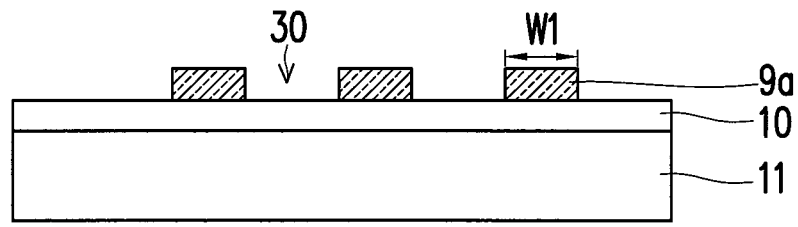
Figure 5:
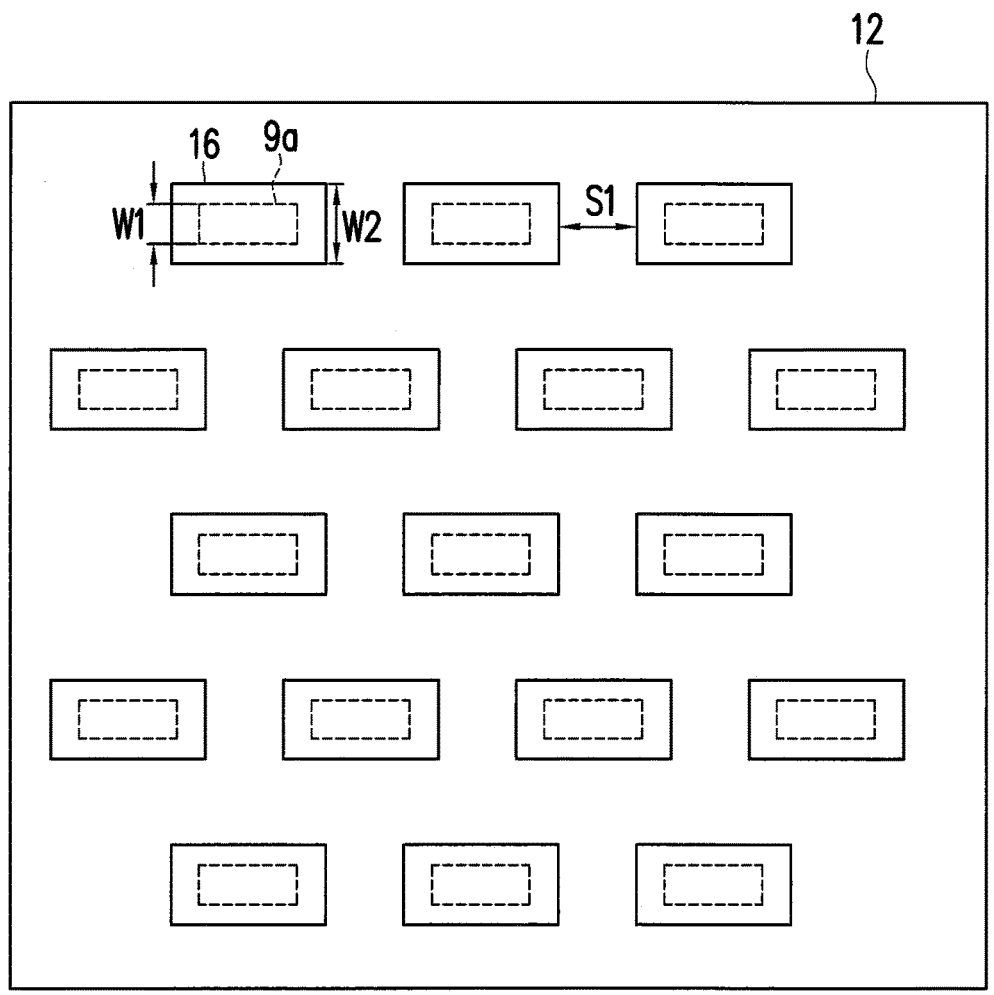
FIG. 5 is a top view of a sparse area according to an embodiment of the present invention.

Referring to FIG. 1B, an etching process is performed to the semiconductor layer 9 by using the patterned mask layer 8 as a mask, so as to form a plurality of dummy patterns 9a. The patterned mask layer 8 is then removed. The plurality of dummy patterns 9a can be distributed evenly or unevenly. As shown in FIG. 5, when the dummy patterns 9a are distributed evenly, each of the dummy patterns 9a has the same size or shape, or the width of a gap 30 between any two adjacent dummy patterns 9a is constant. When the dummy patterns 9a are distributed unevenly, each of the dummy patterns 9a has a different size or shape, or the width of a gap 30 between any two adjacent dummy patterns 9a is not constant. The dummy patterns 9a can be distributed regularly or irregularly. The dummy patterns 9a can be distributed in a regular manner. For example, the size or shape of each dummy pattern 9a, or the width of a gap 30 between any two adjacent dummy patterns 9a can be adjusted by a predetermined rule. The dummy patterns 9a can be distributed in an irregular manner. For example, the size or shape of each dummy pattern 9a, or the width of a gap 30 between any two adjacent dummy patterns 9a can be adjusted irregularly. In some embodiments, the dummy patterns 9a can be separated from each other. Each of the dummy patterns 9a can have a regular or irregular shape. The regular shape can be a block, a strip or a combination thereof. The block may be circular, oval, triangular, square, rectangular (as shown in FIG. 5), polygonal trapezoidal or a combination thereof. The strip may be straight, wavy, serpentine or a combination thereof. In alternative embodiments, the dummy patterns 9a can be connected to form a mesh. In other words, the gaps 30 may be circular, oval, triangular, square, rectangular, polygonal trapezoidal or a combination thereof. The gaps 30 can formed as strips. The strips can be straight, wavy, serpentine or a combination thereof.

Figure 1C:
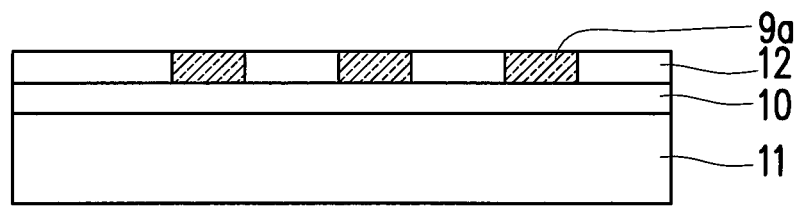

Thereafter, as shown in FIG. 1B and FIG. 1C, a second insulating layer 12 is formed around the plurality of dummy patterns 9a. The second insulating layer 12 includes a material the same as or different from that of the first insulating layer 10. The second insulating layer 12 includes silicon oxide, silicon nitride or a combination thereof. In some embodiments, the method of forming the second insulating layer 12 includes the following steps. A second insulating material layer (not shown) is formed on the SOI substrate 20 by a chemical vapour deposition (CVD) process or a spin coating process. The second insulating material layer is formed on the dummy patterns 9a and fills into the gaps 30 between the dummy patterns 9a. Thereafter, a chemical mechanical polishing (CMP) process or an etching back process is performed by using the dummy patterns 9a as stop layers, so as to remove the second insulating material layer on the dummy patterns 9a. In some embodiments, the surface of the second insulating layer 12 is substantially coplanar with the surfaces of the dummy patterns 9a.

Figure 1D:
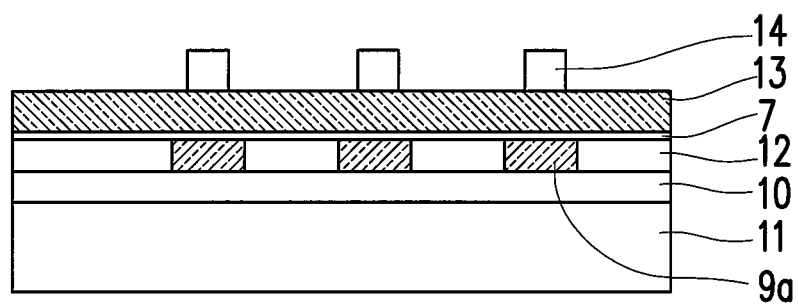

Referring to FIG. 1D, a gate dielectric layer 7 is formed on the dummy patterns 9a and the second insulating layer 12. The gate dielectric layer 7 includes silicon oxide, silicon nitride or a high-k material. The high-k material has a dielectric constant greater than 4, greater than 7 or even greater than 10. The high-k material can be metal oxide, such as rare earth metal oxide. For example, the high-k material includes hafnium oxide ($HfO_2$), hafnium silicon oxide (HfSiO), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$; SBT) or a combination thereof. The method of forming the gate dielectric layer 7 includes performing a CVD process.

Continue referring to FIG. 1D, a conductive layer 13 is formed on the gate dielectric layer 7. The conductive layer 13 can be a single layer, a dual-layer structure or a multi-layer material structure. The conductive layer 13 includes a semiconductor material, a metal material, a metal alloy material or a combination thereof. The semiconductor material includes doped polysilicon, undoped polysilicon, amorphous silicon, a SiGe material or a combination thereof. The metal material includes a metal or a metal compound, such as copper, aluminum, tantalum, tungsten, tantalum nitride or titanium nitride. The metal alloy material includes tungsten, titanium, cobalt, an alloy made of nickel and polysilicon or a copper-aluminum alloy. The method of forming the conductive layer 13 includes performing a CVD or PVD process.

Still referring to FIG. 1D, a patterned mask layer 14 is formed on the conductive layer 13. The positions of patterns of the patterned mask layer 14 correspond to the positions of the dummy patterns 9a. In some embodiments, the patterns of the patterned mask layer 14 and the dummy patterns 9a have substantially the same or similar shape. In an exemplary embodiment, the patterns of the patterned mask layer 14 and the dummy patterns 9a have the same shape, but the patterns of the patterned mask layer 14 have a dimension (e.g., width) smaller than that of the dummy patterns 9a. In alternative embodiments, the patterns of the patterned mask layer 14 and the dummy patterns 9a have substantially different shapes. In an exemplary embodiment, the patterns of the patterned mask layer 14 and the dummy patterns 9a have different shapes, the patterns of the patterned mask layer 14 have a dimension (e.g., width) smaller than that of the dummy patterns 9a, and the boundary of each pattern of the patterned mask layer 14 is within the boundary of the corresponding dummy pattern 9a. The method of forming the patterned mask layer 14 includes forming a photoresist layer, and then preforming exposure and development steps to the photoresist layer.

Figure 1E:
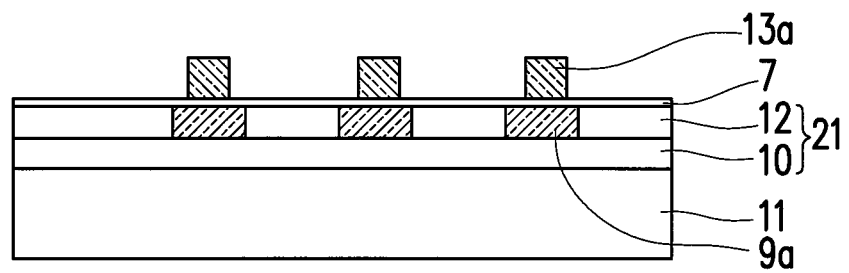

Referring to FIG. 1E, an etching process is performed to the conductive layer 13 by using the patterned mask layer 14 as a mask, so as to form a plurality of dummy gates 13a. The patterned mask layer 14 is then removed. The dummy gates 13a are disposed over the dummy patterns 9a, and the positions of the dummy gates 13a correspond to the positions of the dummy patterns 9a. In some embodiments, the dummy gates 13a and the dummy patterns 9a have the same shape, but the dummy gates 13a have a dimension (e.g., width) smaller than that of the dummy patterns 9a. In some embodiments, the dummy gates 13a and the dummy patterns 9a have different shapes, the dummy gates 13a have a dimension (e.g., width) smaller than that of the dummy patterns 9a, and the boundary of each dummy pattern 9a is within the boundary of the corresponding dummy pattern 9a.

Figure 1F:
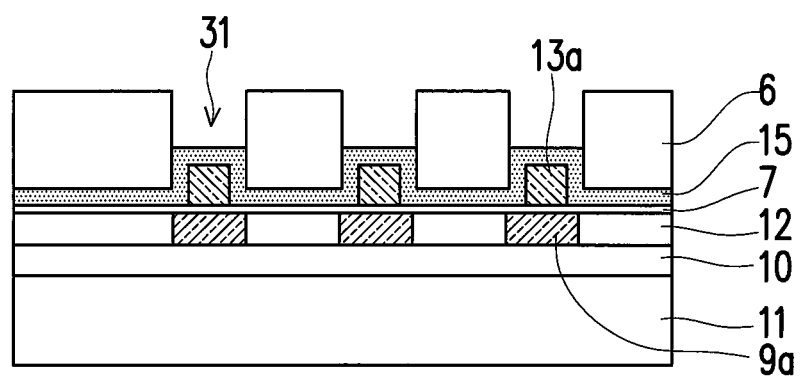

Referring to FIG. 1F, an etching stop layer 15 is formed on the gate dielectric layer 7 and the dummy gates 13a, and covers the gate dielectric layer 7 and the tops and sidewalls of the dummy gates 13a. In some embodiments, the shape of the etching stop layer 15 is a combination of successive U shapes and inverted U shapes arranged alternately. The etching stop layer 15 includes a material different from that of the first insulating layer 12. The etching stop layer 15 includes an insulating material, such as silicon oxide, silicon nitride, silicon oxynitride or a combination thereof. The method of forming the etching stop layer 15 includes performing a CVD process.

Thereafter, a patterned mask layer 6 is formed on the etching stop layer 15. The patterned mask layer 6 can be a patterned photoresist layer. The patterned mask layer 6 has a plurality of openings 31. The positions of the openings 31 correspond to the positions of the dummy patterns 9a, and the openings 31 at least expose the etching stop layer 15 on the dummy patterns 9a. In some embodiments, the openings 31 of the patterned mask layer 6 and the dummy patterns 9a have substantially the same or similar shape. In an exemplary embodiment, the openings 31 of the patterned mask layer 6 and the dummy patterns 9a have the same shape, but the openings 31 of the patterned mask layer 6 have a dimension (e.g., width) equal to or greater than that of the dummy patterns 9a.

Figure 1G:
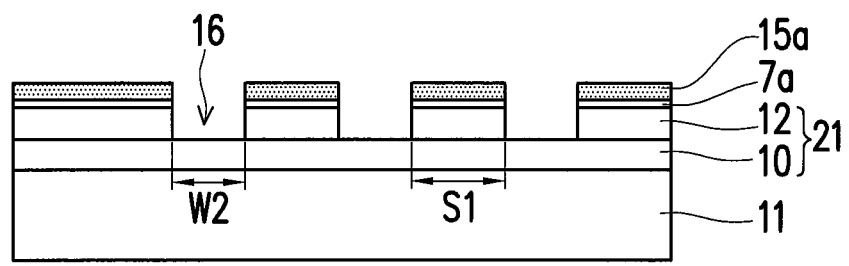

Referring to FIG. 1F, FIG. 1G and FIG. 5, an etching process is performed to the etching stop layer 15 exposed by the openings 31 and to the underlying gate dielectric layer 7 and the dummy patterns 9a by using the patterned mask layer 6 as a mask, so as to form an etching stop layer 15a with openings 16, a gate dielectric layer 7a and a second insulating layer 12. The patterned mask layer 6 is then removed. The bottoms of the openings 16 expose the first insulating layer 10, and the sidewalls of the openings 16 expose the etching stop layer 15a, the gate dielectric layer 7a and the second insulating layer 12. The first insulating layer 10 and the second insulating layer 12 form an insulating structure 21 having the openings 16. The openings 16 have a width W2, and the dummy patterns 9a have a width W1 (FIG. 1B). In some embodiments, $W2 \geq W1$. Two adjacent openings 16 are separated by a distance S1. In some embodiments, the distance S1 can be greater than 0.4 µm. In other words, the patterned mask layer 6 in FIG. 1F can be formed by exposing a photoresist layer with a low-cost photomask and developing the exposed photoresist layer.

Figure 1H:
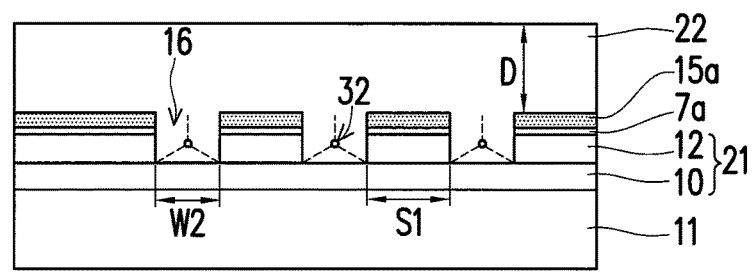

Referring to FIG. 1G and FIG. 1H, a dielectric structure 22 is formed on the substrate 11. The dielectric structure 22 fills into the openings 16. The dielectric structure 22 can include a single layer, a dual-layer structure or a multi-layer structure. In some embodiments, the dielectric structure 22 can be an inter-layer dielectric (ILD) layer. In alternative embodiments, the dielectric structure 22 can include an inter-layer dielectric (ILD) layer and an inter-metal dielectric (IMD) layer. The dielectric structure 22 includes silicon oxide, silicon nitride, a low-k material having a dielectric constant less than 4 or a combination thereof. The low-k material includes hydrogen silsesquioxane (HSQ) or methylsilsesquioxan (MSQ). The method of forming the dielectric structure 22 includes performing a CVD process or a spin coating process. The dielectric structure 22 has a thickness D, and $W2 \leq 2D$.

Continue referring to FIG. 1H, the dielectric structure 22 extends into the openings 16, and covers the surface and sidewall of the etching stop layer 15a, the sidewalls of the gate dielectric layer 7a and the second insulating layer 12, and the surface of the first insulating layer 10. In some embodiments, the dielectric structure 22 in each of the openings 16 has an inverted-Y shaped interface. In alternative embodiments, the dielectric structure 22 formed in the openings 16 has a plurality of air gaps 32 therein.

Figure 1I:
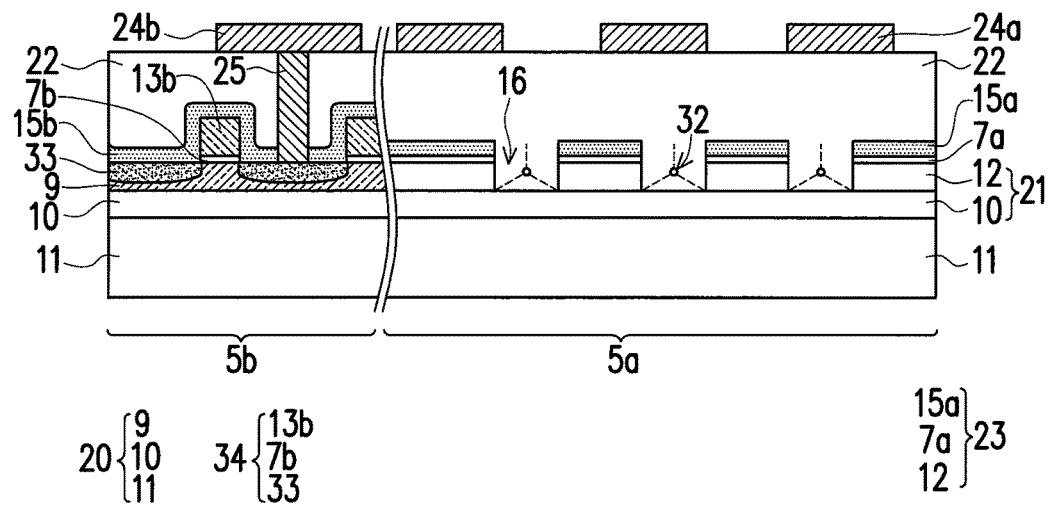
FIG. 1I is a cross-sectional view of a semiconductor device formed by applying the method in accordance with the first embodiment of the concept of the present invention.

The method of the first embodiment describe above can be applied to the method of forming a sparse area of a semiconductor device having different device intensities. FIG. 1I is a cross-sectional view of a semiconductor device formed by applying the method in accordance with the first embodiment of the concept of the present invention.

Referring to FIG. 1I, the substrate 11 includes a sparse area 5a and a dense area 5b. The sparse area 5a can have a structure as shown in FIG. 1H.

Referring to FIG. 1I, in the sparse area 5a, the substrate 11 has a first insulating layer 10 thereon. The first insulating layer 10 has a plurality of protruding structures 23 thereon. The protruding structures 23 include a second insulating layer 12, a gate dielectric layer 7a and an etching stop layer 15a. In some embodiments, the protruding structures 23 are discontinuous or not connected to each other. In alternative embodiments, the protruding structures 23 are continuous or connected to each other. An opening is between two adjacent protruding structures 23. A dielectric structure 22 is disposed on the first insulating layer 10 and fills into the openings 16. In other words, the dielectric structure 22 is engaged with the protruding structures 23. In some embodiments, the dielectric structure 22 in each of the openings 16 has an inverted-Y shaped interface. In alternative embodiments, the dielectric structure 22 in the openings 16 has a plurality of air gaps 32. The dielectric structure 22 can include a single layer, a dual-layer structure or a multi-layer structure. In some embodiments, the dielectric structure 22 can be an inter-layer dielectric (ILD) layer. In alternative embodiments, the dielectric structure 22 can include an inter-layer dielectric (ILD) layer and an inter-metal dielectric (IMD) layer. An element 24a can be subsequently formed on the dielectric structure 22. The element 24a can be a conductive layer. The conductive layer can be an inductor, but the present invention is not limited thereto. In an alternative embodiment, the element 24a further includes a ground-signal-ground (GSG) pad or a combination of an inductor and a GSG pad.

Referring to FIG. 1I, in the dense area 5b, a SOI substrate 20 includes, from bottom to top, a substrate 11, a first insulating layer 10 and a semiconductor layer 9. In other words, the semiconductor layer 9 is formed in the dense area 5b but not in the sparse area 5a. In some embodiments, the semiconductor layer 9 in the dense area 5b is substantially as high as the second insulating layer 12 in the sparse area 5a, and the surface of the semiconductor layer 9 in the dense area 5b is substantially coplanar with the surface of the second insulating layer 12 in the sparse area 5a.

The SOI substrate 20 has a MOS effect transistor 34 formed thereon. The MOS effect transistor 34 includes a gate dielectric layer 7b, a gate 13b and doped regions 33. The gate dielectric layer 7b and the gate dielectric layer 7a can be formed simultaneously by performing the same patterning step (FIG. 1G) to the same gate dielectric layer 7 (FIG. 1D). The gate 13b and the dummy gates 13a (FIG. 1E) can be formed simultaneously by performing the same patterning step (FIG. 1E) to the same conductive layer 13 (FIG. 1D). The SOI substrate 20 has an etching stop layer 15b and a dielectric structure 22 formed on the MOS effect transistor 34. The etching stop layer 15b in the dense area 5b and the etching stop layer 15a in the sparse area 5a can be formed simultaneously by performing the same patterning step (FIG. 1G) to the same etching stop layer 15 (FIG. 1F). A conductive wire 24b is formed on the dielectric structure 22. The conductive wire 24b is electrically connected to the doped regions 33 via a contact plug 25 that penetrates through the dielectric structure 22 and the etching stop layer 15b. The conductive wire (or called a metal wire) 24b and the element 24a can be formed simultaneously by performing the same patterning step to the same conductive layer. The conductive layer includes a metal material, a metal alloy material or a combination thereof. The metal material includes a metal or a metal compound, such as copper, aluminum, tantalum, tungsten, tantalum nitride or titanium nitride. The metal alloy material includes tungsten, titanium, cobalt, an alloy made of nickel and polysilicon or a copper-aluminum alloy. The method of forming the conductive layer includes performing a CVD or PVD process.

In some embodiments, in addition to the contact plug 25, a multi-layer conductive wire structure (or called a multi-layer metal wire structure) and vias (not shown) can be further formed in the dielectric structure 22 in the dense area 5b. However, in the sparse area 5a, the dielectric structure 22 disposed below the element 24a can be formed without contact plugs, conductive wires (or called a multi-layer metal wire structure) and vias. Alternatively, the number of layers of conductive wires (or called a multi-layer metal wire structure) and vias in the spares area 5a is less than the number of layers of conductive wires (or called a multi-layer metal wire structure) and vias in the dense area 5b.

FIG. 2A to FIG. 2F are cross-sectional views of a method of fabricating a semiconductor device in accordance with a second embodiment of the concept of the present invention. FIG. 2G is a cross-sectional view of a semiconductor device formed by applying the method in accordance with the second embodiment of the concept of the present invention.

Figure 2A:
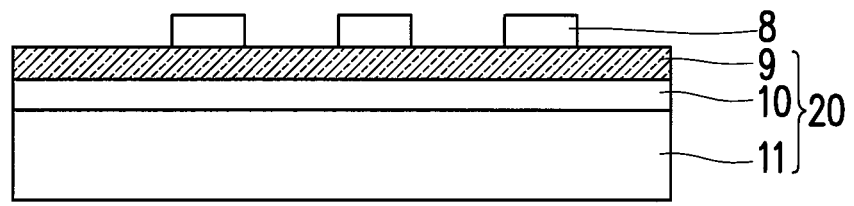
FIG. 2A to FIG. 2F are cross-sectional views of a method of fabricating a semiconductor device in accordance with a second embodiment of the concept of the present invention.
Figure 2B:
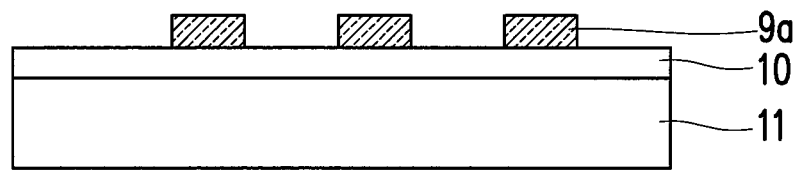
Figure 2C:
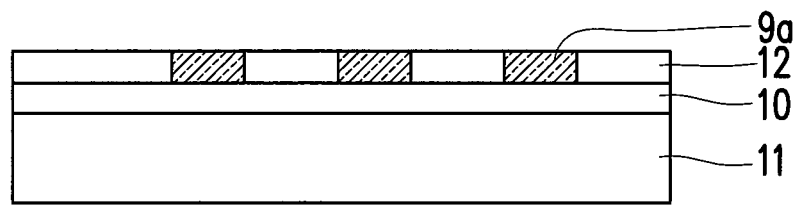
Figure 2D:
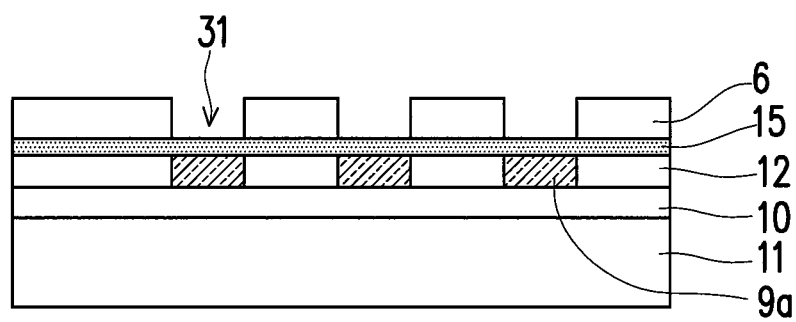
Figure 2E:
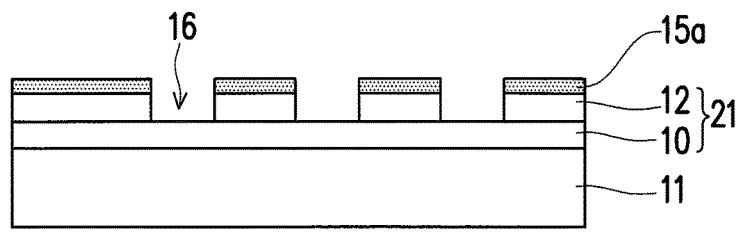
Figure 2F:
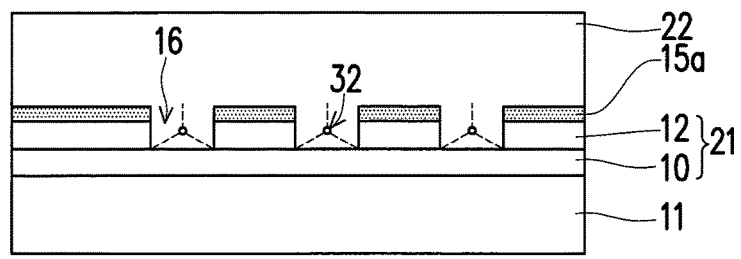
Figure 2G:
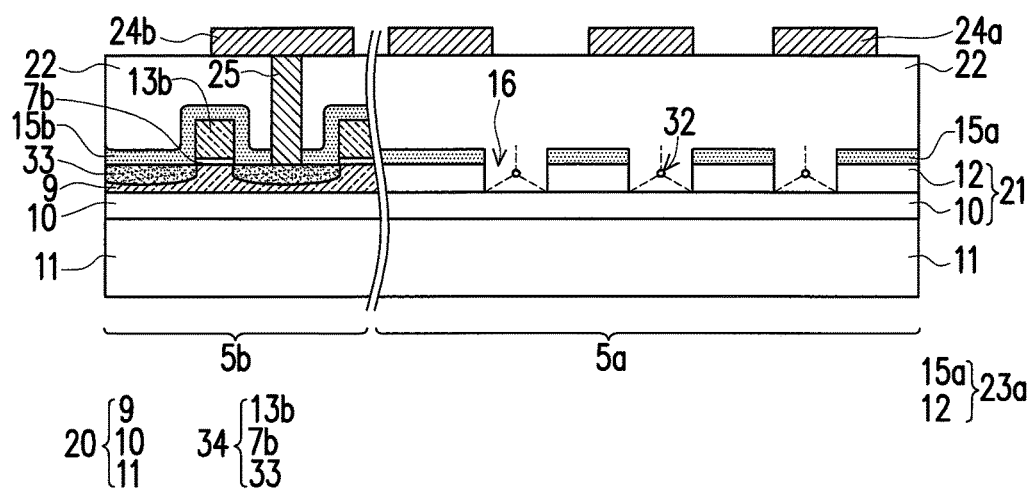
FIG. 2G is a cross-sectional view of a semiconductor device formed by applying the method in accordance with the second embodiment of the concept of the present invention.

Referring to FIG. 2A to FIG. 2G, the method of the second embodiment is similar to that of the first embodiment, and the difference between them lies in that the etching stop layer 15 (FIG. 2D) is directly formed on the dummy patterns 9a and the second insulating layer 12. In other words, the gate dielectric layer 7 and the conductive layer 13 are not present between the etching stop layer 15 and the dummy patterns 9a. Alternatively, the gate dielectric layer 7 and the conductive layer 13 as shown in FIG. 1D are formed on the dummy patterns 9a and second insulating layer 12, but are then removed before forming the etching stop layer 15. Thereafter, an etching process is performed by using the patterned mask layer 6 as a mask, and the formed etching stop layer 15a directly covers the second insulating layer 12 (FIG. 2E). In other words, as shown in FIG. 2F and FIG. 2G, the protruding structures 23a include the second insulating layer 12 and the etching stop layer 15a, but do not include the gate dielectric layer 7a (FIG. 1H). The protruding structures 23a are engaged with the dielectric structure 22.

FIG. 3A to FIG. 3G are cross-sectional views of a method of fabricating a semiconductor device in accordance with a third embodiment of the concept of the present invention. FIG. 3H is a cross-sectional view of a semiconductor device formed by applying the method in accordance with the third embodiment of the concept of the present invention.

Figure 3A:
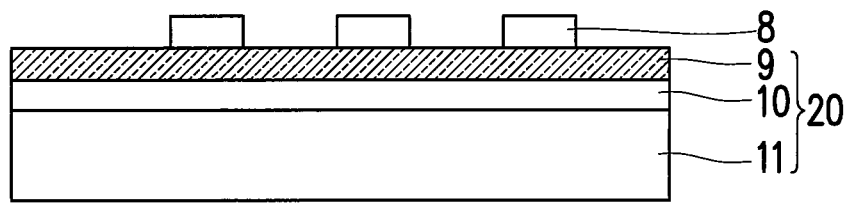
FIG. 3A to FIG. 3G are cross-sectional views of a method of fabricating a semiconductor device in accordance with a third embodiment of the concept of the present invention.
Figure 3B:
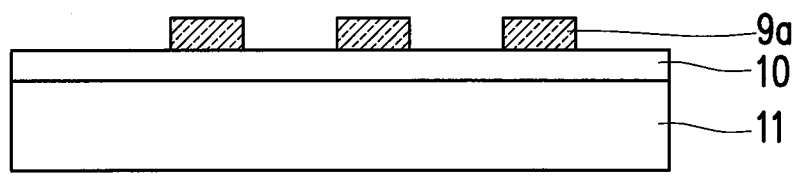
Figure 3C:
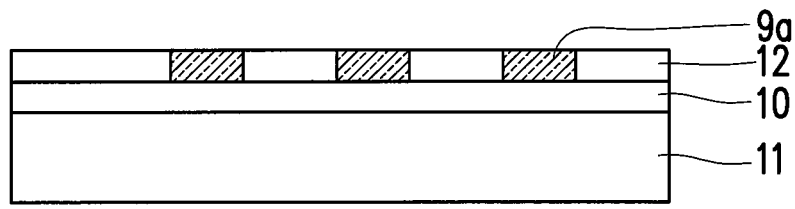
Figure 3D:
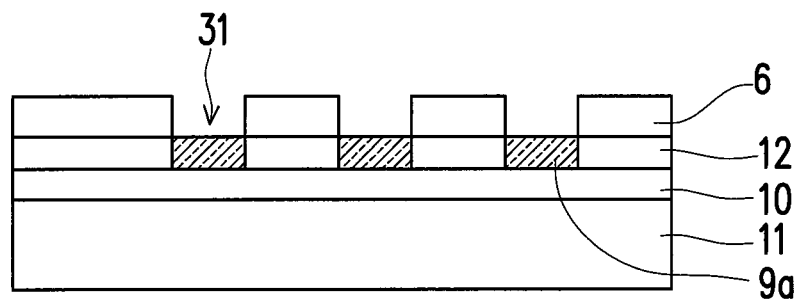
Figure 3E:
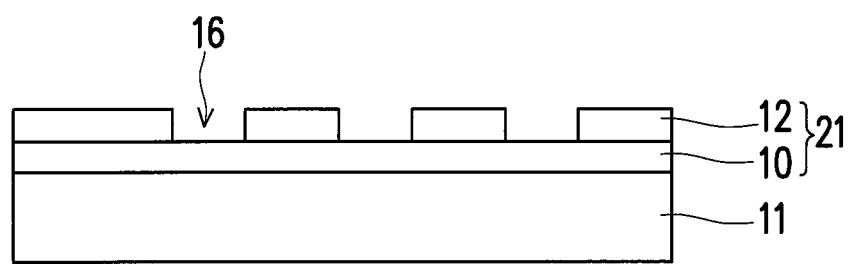
Figure 3F:
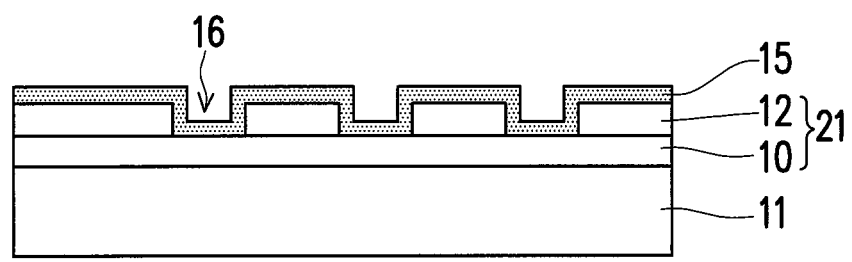
Figure 3G:
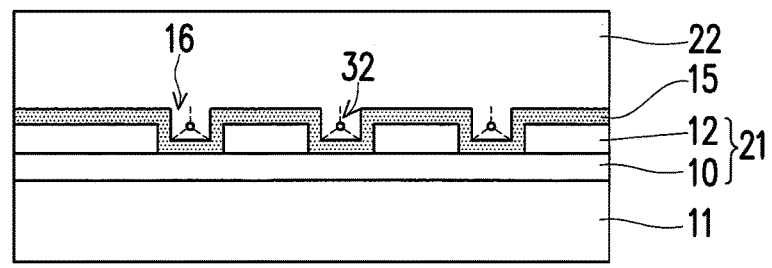
Figure 3H:
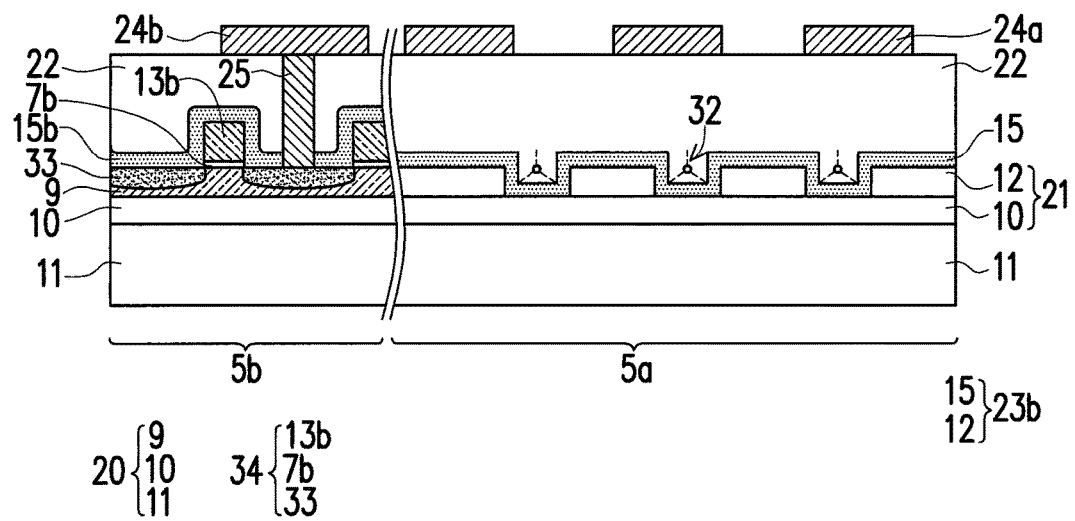
FIG. 3H is a cross-sectional view of a semiconductor device formed by applying the method in accordance with the third embodiment of the concept of the present invention.

Referring to FIG. 3A to FIG. 3G, the method of the third embodiment is similar to that of the second embodiment, and the difference between them lies in that the etching stop layer 15 (FIG. 3F) is formed after the dummy patterns 9a are removed. In other words, the etching stop layer 15 is formed on the surface of the second insulating layer 12 and on the sidewalls and bottoms of the openings 16. The etching stop layer 15 is a continuous layer. In some embodiments, the shape of the etching stop layer 15 is a combination of continuous U shapes and inverted U shapes arranged alternately. In other words, as shown in FIG. 3F and FIG. 3G, the etching stop layer 15 is interposed between the insulating structure 21 and the dielectric structure 22. From another point of view, the etching stop layer 15 and the second insulating layer 12 form protruding structures 23b, and the protruding structures 23b are engaged with the dielectric structure 22.

FIG. 4A to FIG. 4F are cross-sectional views of a method of fabricating a semiconductor device in accordance with a fourth embodiment of the concept of the present invention. FIG. 4G is a cross-sectional view of a semiconductor device formed by applying the method in accordance with the fourth embodiment of the concept of the present invention.

Figure 4A:
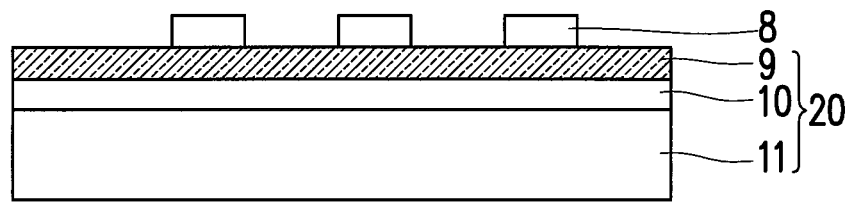
FIG. 4A to FIG. 4F are cross-sectional views of a method of fabricating a semiconductor device in accordance with a fourth embodiment of the concept of the present invention.
Figure 4B:
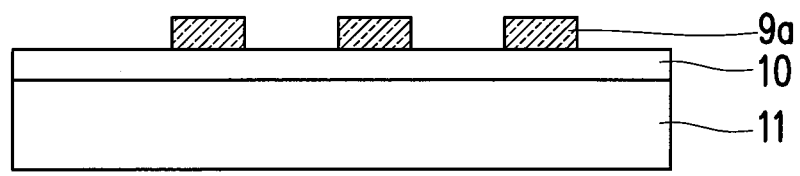
Figure 4C:
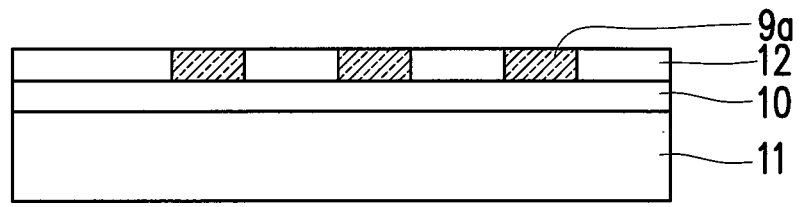
Figure 4D:
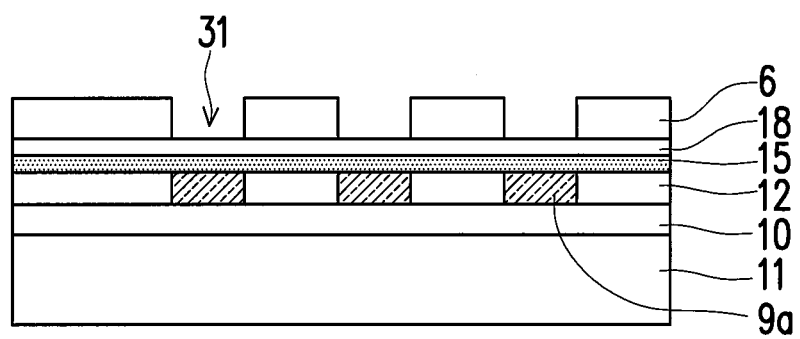

Referring to FIG. 4A to FIG. 4D, steps similar to those of the first embodiment are performed, in which a semiconductor layer 9 of a SOI substrate 20 is patterned to form a plurality of dummy patterns 9a, and a second insulating layer 12 is formed around the dummy patterns 9a. Thereafter, an etching stop layer 15 is formed on the dummy patterns 9a and the second insulating layer 12. The etching stop layer 15 is directly formed on the dummy patterns 9a and the second insulating layer 12 (FIG. 4D). Similarly, the gate dielectric layer 7 and the conductive layer 13 (FIG. 1D) are not present between the etching stop layer 15 and the dummy patterns 9a. Alternatively, the gate dielectric layer 7 and the conductive layer 13 as shown in FIG. 1D are formed on the dummy patterns 9a and second insulating layer 12, but are then removed before forming the etching stop layer 15.

Continue referring to FIG. 4D, after forming the etching stop layer 15 and before forming a patterned mask layer 6, a first a dielectric layer 18 is formed on the etching stop layer 15. The first dielectric layer 18 includes silicon oxide, silicon nitride, a low-k material having a dielectric constant less than 4 or a combination thereof. The low-k material includes hydrogen silsesquioxane (HSQ) or methylsilsesquioxan (MSQ). The method of forming the first dielectric layer 18 includes performing a CVD process or a spin coating process.

Figure 4E:
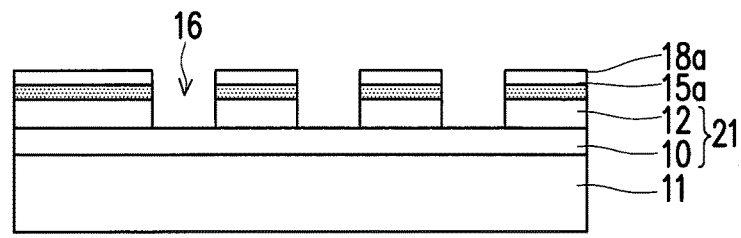

Referring to FIG. 4D and FIG. 4E, after forming the patterned mask layer 6, an etching process is performed to the first dielectric layer 18, the etching stop layer 15 and the dummy patterns 9a by using the patterned mask layer 6 as a mask, so as to form openings 16 through a first patterned dielectric layer 18a, an etching stop layer 15a and a second insulating layer 12. The patterned mask layer 6 is then removed. The bottoms of the openings 16 expose the first insulating layer 10. The sidewalls of the openings 16 expose the first patterned dielectric layer 18a, the etching stop layer 15a and the second insulating layer 12. The first insulating layer 10 and the second insulating layer 12 form an insulating structure 21 having the openings 16. The etching stop layer 15a and the first patterned dielectric layer 18a are disposed on the second insulating layer 12 of the insulating structure 21.

Figure 4F:
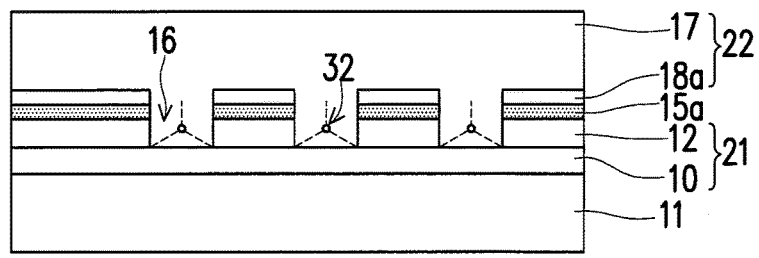
Figure 4G:
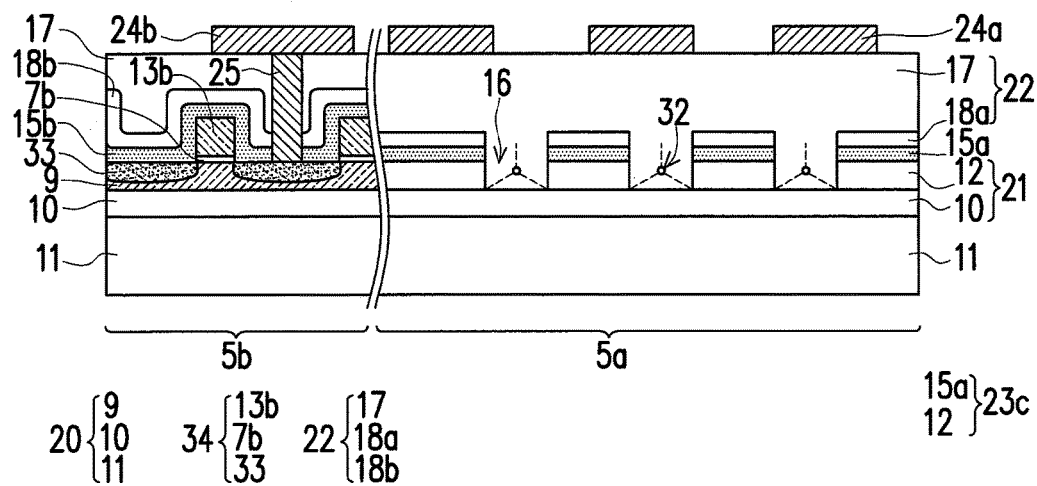
FIG. 4G is a cross-sectional view of a semiconductor device formed by applying the method in accordance with the fourth embodiment of the concept of the present invention.

Referring to FIG. 4F, a second dielectric layer 17 is formed on the substrate 11. The second dielectric layer 17 and the first patterned dielectric layer 18a includes the same material or different materials. The second dielectric layer 17 includes silicon oxide, silicon nitride, a low-k material having a dielectric constant less than 4 or a combination thereof. The low-k material includes hydrogen silsesquioxane (HSQ) or methylsilsesquioxan (MSQ). The method of forming the second dielectric layer 17 includes performing a CVD process or a spin coating process. The second dielectric layer 17 is disposed on the first patterned dielectric layer 18a, extends into the openings 16, and covers the top and sidewall of the first patterned dielectric layer 18a and the sidewalls of the etching stop layer 15a and the second insulating layer 12. The second dielectric layer 17 and the first patterned dielectric layer 18a form a dielectric structure 22. The etching stop layer 15a is disposed between the insulating structure 21 and the dielectric structure 22. From another point of view, the etching stop layer 15a and the second insulating layer 12 form a plurality of protruding structures 23c, and the protruding structures 23c are engaged with the dielectric structure 22.

In FIG. 4G, the dense area 5b has a structure similar to that of FIG. 3H, and this structure further includes a first patterned dielectric layer 18a disposed between the second dielectric layer 17 and the etching stop layer 15a.

FIG. 6A to FIG. 6F are cross-sectional views of a method of fabricating a semiconductor device in accordance with a fifth embodiment of the concept of the present invention. FIG. 6G is a cross-sectional view of a semiconductor device formed by applying the method in accordance with the fifth embodiment of the concept of the present invention.

Figure 6A:
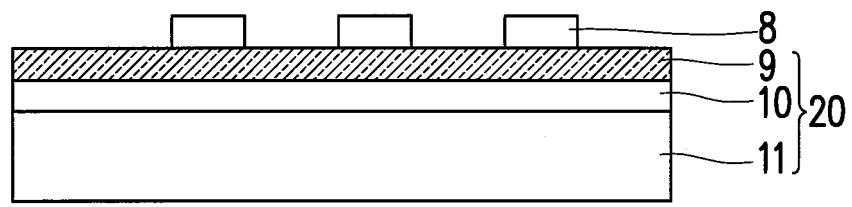
FIG. 6A to FIG. 6F are cross-sectional views of a method of fabricating a semiconductor device in accordance with a fifth embodiment of the concept of the present invention.
Figure 6B:
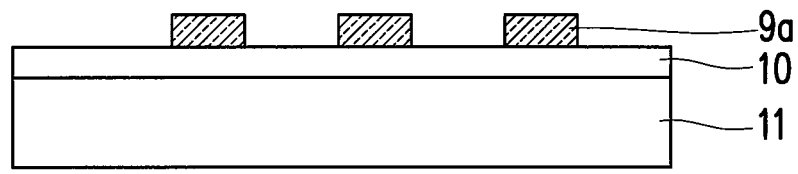
Figure 6C:
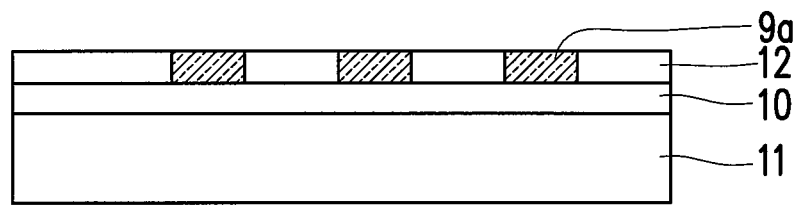
Figure 6D:
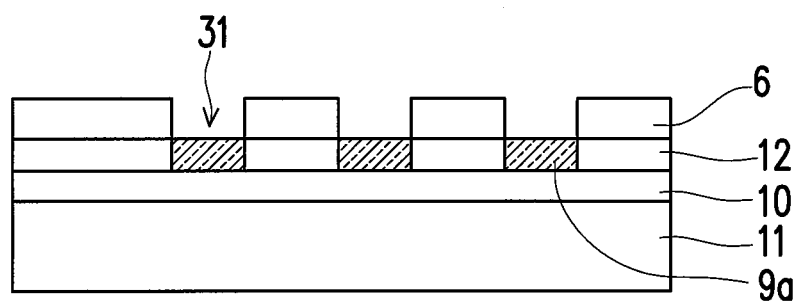
Figure 6E:
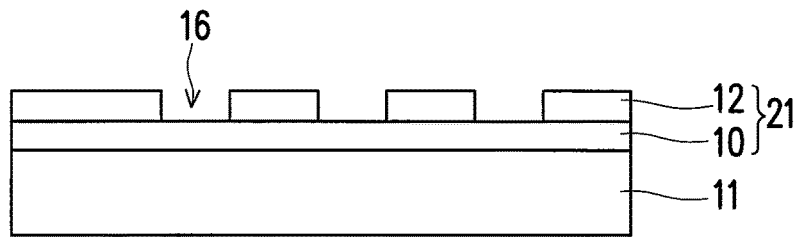
Figure 6F:
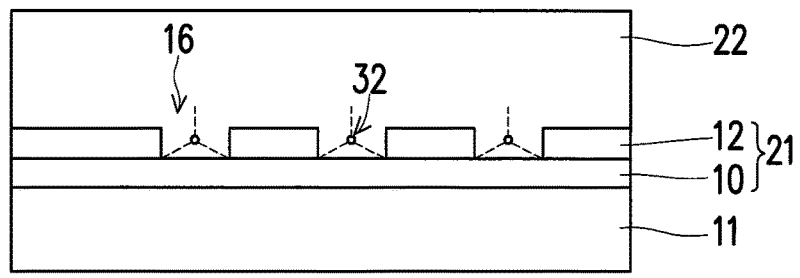
Figure 6G:
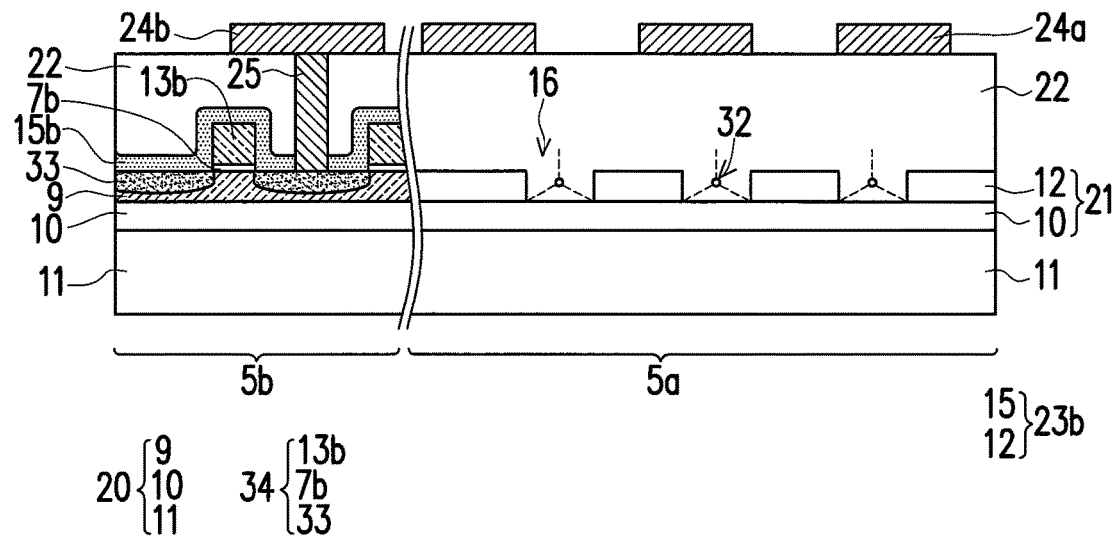
FIG. 6G is a cross-sectional view of a semiconductor device formed by applying the method in accordance with the fifth embodiment of the concept of the present invention.

Referring to FIG. 6A to FIG. 6F, the method of the fifth embodiment is similar to that of the third embodiment, and the difference between them lies in that the etching stop layer 15 is not present between the insulating structure 21 and the dielectric structure 22. In other words, as shown in FIG. 6D and FIG. 6E, after removing the dummy patterns 9, the etching stop layer 15 is not formed. Alternatively, an etching stop layer 15 is formed and then removed. Therefore, in the sparse area 5b of FIG. 6G, the etching stop layer 15 is not present between the insulating structure 21 and the dielectric structure 22. However, in the dense area 5a, the remaining etching stop layer 15b covers the MOS effect transistor 34.

In summary, during the method of fabricating a device of the invention, dummy patterns and optional dummy gates are formed on a substrate in a sparse area, so the sparse area has a density or hardness comparable to that of the dense area. Therefore, during the subsequent polishing process, the loading effect caused by different device densities in respective regions on the substrate can be avoided. The dummy patterns and dummy gates are then removed from the sparse area before the subsequent processes for the device are performed. Thus, the device performance is not affected by the dummy gates since the dummy gates do not remain on the substrate.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a semiconductor device, comprising:
    providing a semiconductor-on-insulator (SOI) substrate, wherein the SOI substrate comprises, from bottom to top, a substrate, a first insulating layer and a semiconductor layer;
    patterning the semiconductor layer to form a plurality of dummy patterns;
    forming a second insulating layer around the plurality of dummy patterns;
    removing the plurality of dummy patterns to form a plurality of openings; and
    forming a dielectric structure on the substrate, wherein the dielectric structure fills into the plurality of openings,
    wherein the method further comprises, after forming the second insulating layer around the plurality of dummy patterns, forming an etching stop layer on the substrate and patterning the etching stop layer, and
    wherein the method further comprises:
    before forming the etching stop layer on the substrate, forming a gate dielectric layer on the substrate;

forming a plurality of dummy gates on the gate dielectric layer, the plurality of dummy gates corresponding to the plurality of dummy patterns; and before removing the plurality of dummy patterns, removing the plurality of dummy gates and a portion of the gate dielectric layer.

2. The method of claim 1, further comprising:

after removing the plurality of dummy patterns to form the plurality of openings, forming an etching stop layer on the substrate, wherein the etching stop layer covers a surface of the second insulating layer and sidewalls and bottoms of the plurality of openings.

3. A method of fabricating a semiconductor device, comprising:

providing a semiconductor-on-insulator (SOI) substrate, wherein the SOI substrate comprises, from bottom to top, a substrate, a first insulating layer and a semiconductor layer;

patterning the semiconductor layer to form a plurality of dummy patterns;

forming a second insulating layer around the plurality of dummy patterns;

removing the plurality of dummy patterns to form a plurality of openings; and forming a dielectric structure on the substrate, wherein the dielectric structure fills into the plurality of openings, wherein the method further comprises, after forming the second insulating layer around the plurality of dummy patterns, forming an etching stop layer on the substrate and patterning the etching stop layer, and wherein the step of forming the dielectric structure on the substrate comprises:

before patterning the etching stop layer, forming a first dielectric layer on the etching stop layer and patterning the first dielectric layer to form a first patterned dielectric layer; and after patterning the etching stop layer and removing the plurality of dummy patterns, forming a second dielectric layer, wherein the second dielectric layer covers the first patterned dielectric layer and fills into the plurality of openings.

* * * * *